US012364076B2

(12) United States Patent
Ikeda et al.

(10) Patent No.: US 12,364,076 B2
(45) Date of Patent: Jul. 15, 2025

(54) DISPLAY DEVICE

(71) Applicant: Japan Display Inc., Tokyo (JP)

(72) Inventors: Masanobu Ikeda, Tokyo (JP); Jin Hirosawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 480 days.

(21) Appl. No.: 17/944,189

(22) Filed: Sep. 14, 2022

(65) Prior Publication Data

US 2023/0006113 A1  Jan. 5, 2023

Related U.S. Application Data

(63) Continuation of application No. PCT/JP2021/006616, filed on Feb. 22, 2021.

(30) Foreign Application Priority Data

Mar. 25, 2020  (JP) .................. 2020-053861

(51) Int. Cl.
| | |
|---|---|
| *H10H 20/856* | (2025.01) |
| *H01L 25/16* | (2023.01) |
| *H10H 20/831* | (2025.01) |
| *H10H 20/858* | (2025.01) |
| *H10H 20/833* | (2025.01) |

(52) U.S. Cl.
CPC ......... *H10H 20/856* (2025.01); *H01L 25/167* (2013.01); *H10H 20/831* (2025.01); *H10H 20/8581* (2025.01); *H10H 20/833* (2025.01)

(58) Field of Classification Search
CPC .................................................. H10H 20/856

USPC .......................................................... 257/91
See application file for complete search history.

(56) References Cited

U.S. PATENT DOCUMENTS

2013/0056714 A1\* 3/2013 Hasegawa ............ H10K 59/131
  438/23

FOREIGN PATENT DOCUMENTS

JP  2016-109932 A  6/2016

OTHER PUBLICATIONS

International Search Report and Written Opinion mailed on Apr. 27, 2021, received for PCT Application PCT/JP2021/006616, filed on Feb. 22, 2021, 8 pages including English Translation.

\* cited by examiner

*Primary Examiner* — Hsin Yi Hsieh
(74) *Attorney, Agent, or Firm* — XSENSUS LLP

(57) ABSTRACT

A display device includes a first electrode, and LED chip on the first electrode, an insulating layer embeds the first electrode, contacts a side surface of the LED chip, and exposes an upper surface, a second electrode having translucency in contact with an upper surface of the insulating layer and the upper surface of the LED chip, and a first reflection control layer on an upper surface of the second electrode and having a first opening in an area overlapping with the LED chip. The first reflection control layer has a first surface on a side of the second electrode and a second surface on opposite to the first surface, and a reflectance of the first surface is higher than a reflectance of the second surface.

14 Claims, 9 Drawing Sheets

DISPLAY DEVICE

CROSS-REFERENCE TO RELATED APPLICATIONS

This application is a Continuation of International Patent Application No. PCT/JP2021/006616, filed on Feb. 22, 2021, which claims the benefit of priority to Japanese Patent Application No. 2020-053861, filed on Mar. 25, 2020, the entire contents of each are incorporated herein by reference.

FIELD

An embodiment of the present invention relates to a display device. An embodiment of the present invention disclosed in this application relates to a pixel structure of a display device.

BACKGROUND

A display device using a display unit that includes a plurality of light-emitting elements mounted on a substrate, a waterproof coating member made of a filler provided around the plurality of light-emitting elements, and a reflection suppressing layer 24 for suppressing a reflection of external light incident on light-emitting surfaces of the plurality of light-emitting elements is formed is disclosed (refer to Japanese laid-open patent publication No. 2016-109932). This display device is provided with a mask member around the light-emitting element, and the reflection suppressing layer for suppressing the reflection of external light incident on the light-emitting surface of the light-emitting element is formed.

SUMMARY

A display device according to an embodiment of the present invention includes a first electrode, an LED chip on the first electrode, an insulating layer embeds the first electrode, contacts a side surface of the LED chip, and exposes an upper surface, a second electrode having translucency in contact with an upper surface of the insulating layer and the upper surface of the LED chip, and a first reflection control layer on an upper surface of the second electrode and having a first opening in an area overlapping with the LED chip. The first reflection control layer has a first surface on a side of the second electrode and a second surface on opposite to the first surface, and a reflectance of the first surface is higher than a reflectance of the second surface.

DESCRIPTION OF EMBODIMENTS

Embodiments of the present invention will be described below with reference to the drawings and the like. However, the present invention can be implemented in many different aspects and should not be construed as being limited to the description of the following embodiments. For the sake of clarity of explanation, although the drawings may be schematically represented with respect to widths, thicknesses, shapes, and the like of the respective portions in comparison with actual embodiments, they are merely examples and do not limit the interpretation of the present invention. In addition, in this specification and each of the drawings, the same symbols (or symbols denoted by a, b, and the like) are given to the same elements as those described above with reference to the preceding drawings, and detailed description thereof may be omitted as appropriate. Furthermore, the letters "first" and "second" to each element are convenient labels used to distinguish each element and have no further meaning unless otherwise stated.

In this specification, in the case where a member or area is "above (or below)" another member or area, it includes not only being directly above (or below) another member or area, but also being above (or below) another member or area unless otherwise limited. i.e., including the case where other components are included in between above (or below) another member or area.

In an embodiment of the present invention, a micro-LED means a chip having a size of several micrometers or more and 100 µm or less, and a mini-LED means a chip having a size of 100 µm or more. An embodiment of the present invention can use LEDs of any size and can be appropriately used depending on the screen size and pixel density of a display device.

Incidentally, the light-emitting element described in Japanese laid-open patent publication No. 2016-109932, the reflection suppressing layer is formed of a diffusing material by glass beads or resin beads, and the reflection of external light on the light-emitting surface is reduced by scattering the external light, thereby causing a problem of lowering the resolution. In addition, since the light-emitting element described in Japanese laid-open patent publication No. 2016-109932 is based on a configuration in which an LED chip is provided in a mold resin, there is a problem that the reflection suppressing layer cannot be applied to pixels of the display device formed by fine LED chips called a micro-LED and mini-LED. Furthermore, since the mask member is a flat plate-shaped member painted in black lacquer with no gloss, the temperature rises when exposed external light, causing the brightness of the light-emitting element (LED chip) to decrease, which is a problem. An embodiment of the present invention disclosed below will overcome these problems.

Figure 1:
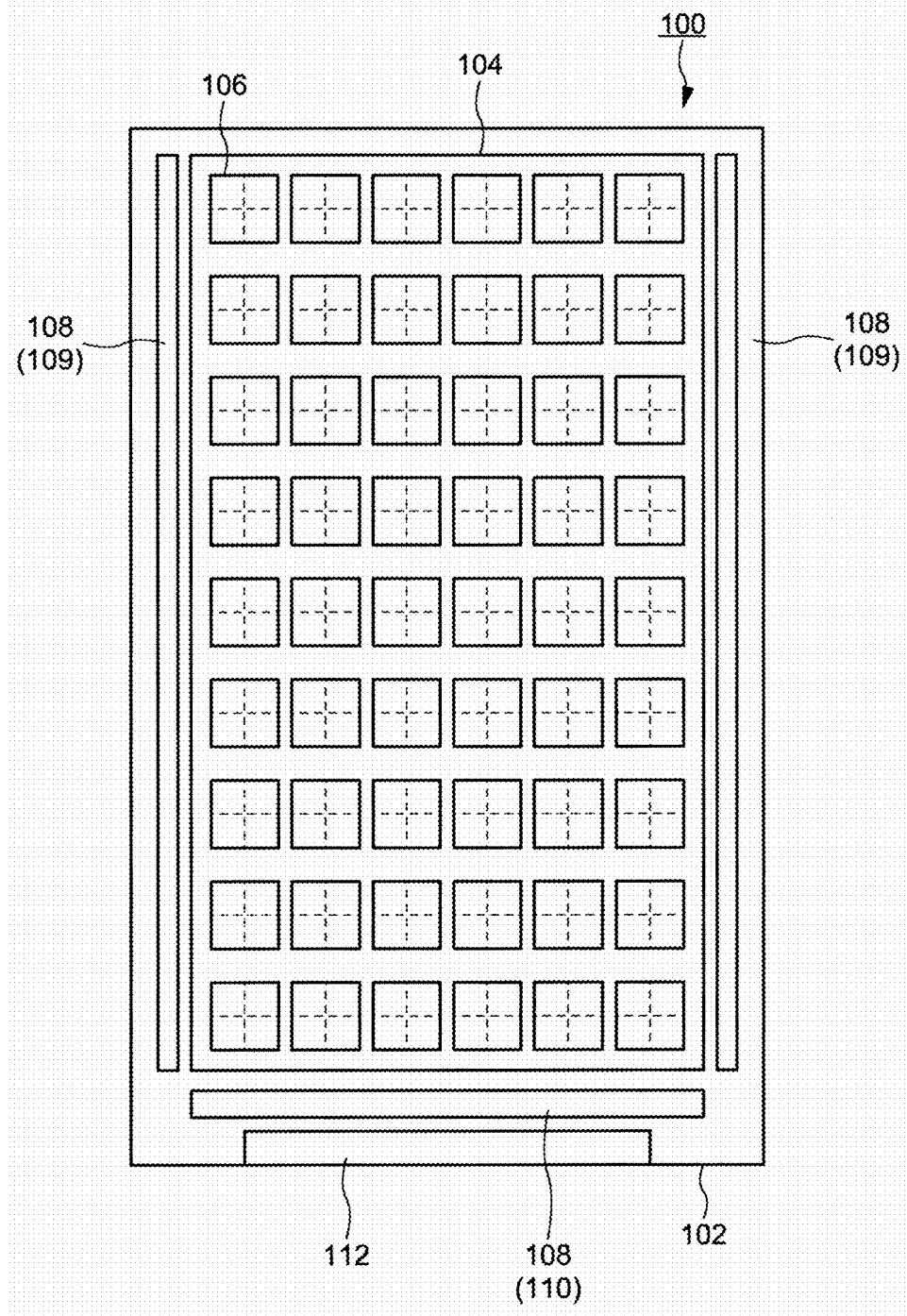
FIG. 1 is a diagram showing a configuration of a display device according to an embodiment of the present invention.

FIG. 1 shows a configuration of a display device 100 according to an embodiment of the present invention. The display device 100 includes a display unit 104 arranged on a substrate 102, a drive circuit 108 and a terminal 112 arranged on an outer area of the display unit 104. The drive circuit 108 includes a scanning line drive circuit 109 for outputting a scan signal and a data line drive circuit 110 for driving a data signal. The display unit 104 includes at least one pixel 106. At least one pixel 106 consists of a plurality of pixels 106, and the plurality of pixels 106 is arranged in a row direction and in a column direction.

Figure 2:
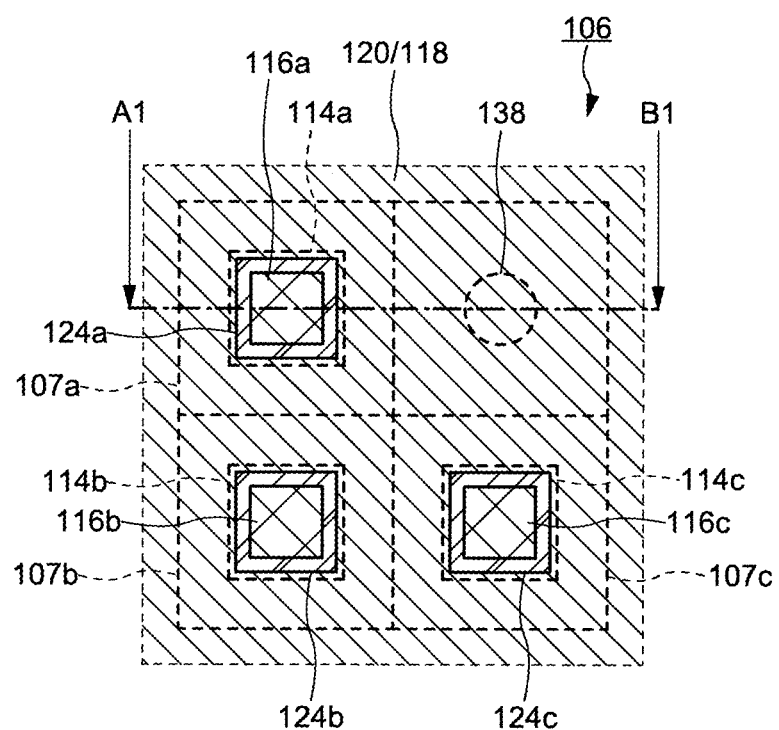
FIG. 2 is a plan view showing a pixel configuration of a display device according to an embodiment of the present invention.

FIG. 2 is shown a plan view of the pixel 106. The pixel 106 includes a first sub-pixel 107a, a second sub-pixel 107b, and a third sub-pixel 107c. The first sub-pixel 107a is arranged with a first electrode 114a and a first LED chip 116a, the second sub-pixel 107b is arranged with a first electrode 114b and a second LED chip 116b, and the third sub-pixel 107c is arranged with a first electrode 114c and a third LED chip 116c. In addition, the pixel 106 includes a second electrode 118. The second electrode 118 is arranged on the first LED chip 116a, the second LED chip 116b, and the third LED chip 116c, and extends to an area of the first sub-pixel 107a, the second sub-pixel 107b, and the third sub-pixel 107c. A first reflection control layer 120 is arranged on the second electrode 118. The first reflection control layer 120 is arranged with a first opening 124 (first opening 124a, first opening 124b, first opening 124c) to expose the LED chip of each sub-pixel.

Figure 3:
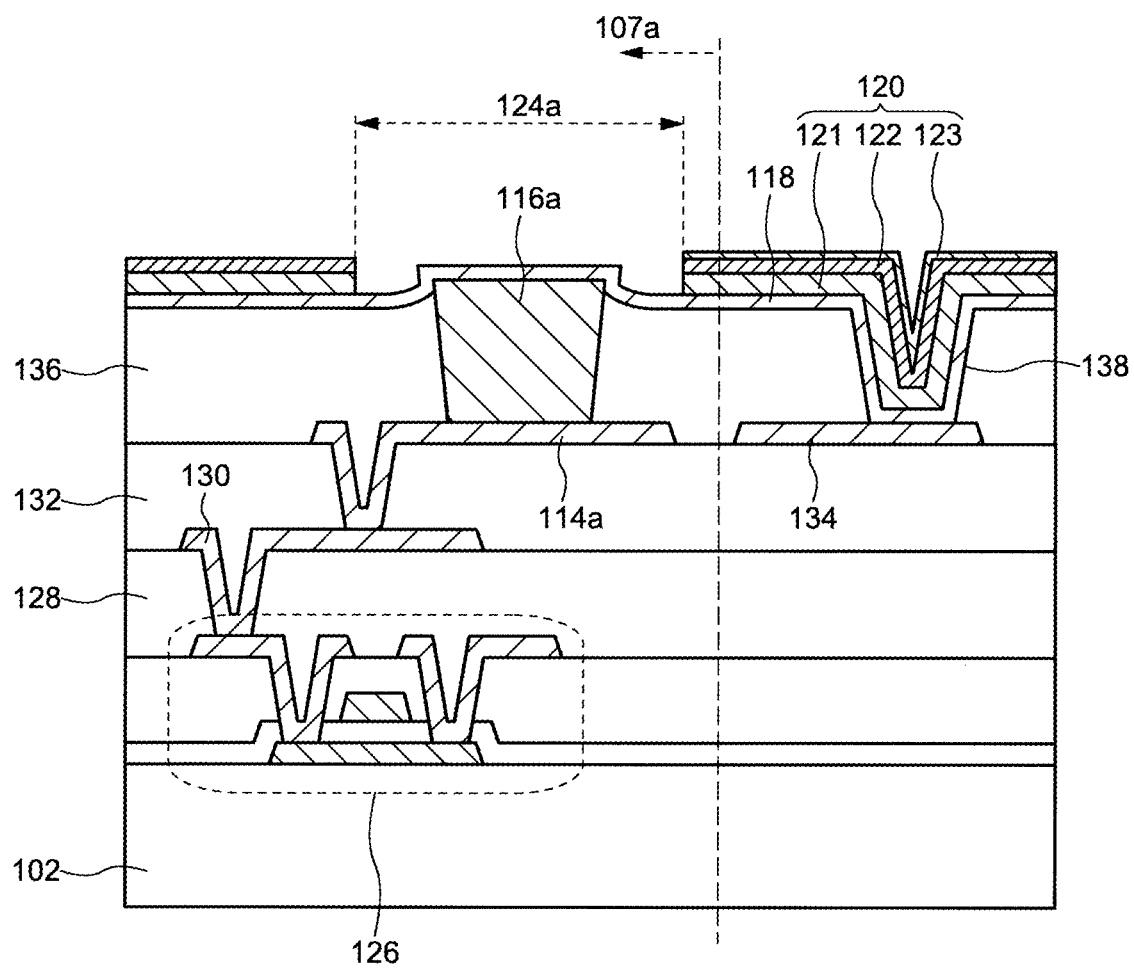
FIG. 3 is a cross-sectional view showing a pixel configuration of a display device according to an embodiment of the present invention.

The first LED chip 116a, the second LED chip 116b, and the third LED chip 116c are bare chips, and fine LEDs also called micro-LEDs or mini-LEDs are used. The LED chip arranged in each sub-pixel may appropriately select a micro-LED or a mini-LED depending on the size of the sub-pixel. The first LED chip 116a, the second LED chip 116b, and the third LED chip 116c are two terminal elements and have anode terminals and cathode terminals (not shown). As shown in FIG. 3 below, the LED chip in each sub-pixel has, for example, the anode terminal electrically connected to the first electrode 114, and the cathode terminal electrically connected to the second electrode 118. Also, the electrical connection of the LED chip is not limited thereto and the anode terminal may be electrically connected to the second electrode and the cathode terminal may be electrically connected to the first electrode.

FIG. 2 is also shown a contact hole 138 for connecting the second electrode 118 to the pixel 106 with a wiring in a lower layer (second wiring 134) which is not shown. Since the second electrode 118 is formed of a transparent conductive film and is arranged on substantially the entire surface of the display unit 104, the resistance loss can be suppressed by connecting the lower layer wiring (second wiring 134) in the pixel 106 through the contact hole 138.

FIG. 3 is a cross-sectional structure of the pixel 106 shown in FIG. 2 along a line A1-B1. Specifically, FIG. 3 shows a structure of the first sub-pixel 107a. FIG. 3 exemplarily shows an embodiment in which the first sub-pixel 107a includes a transistor 126 in addition to the first LED chip 116a. The transistor 126 is used as an element for controlling the light emission of the first LED chip 116a. The transistor 126 arranged on the substrate 102 is, for example, a thin film transistor, and there is no particular limitation on its element structure. A first insulating layer 128 is arranged on a side of an upper layer of the transistor 126. A second insulating layer 132 is arranged above the first insulating layer 128, and the first electrode 114a is arranged above the second insulating layer 132.

The first sub-pixel 107a has a structure in which the first electrode 114a and the transistor 126 are electrically connected to each other via a first wiring 130 arranged on the second insulating layer 132. The first LED chip 116a is arranged above the first electrode 114a. Although not shown, the first LED chip 116a has an anode terminal on one surface side (substrate 102 side) and a cathode terminal on the other surface side (the side opposite to the substrate 102). One terminal of the first LED chip 116a (e.g., the anode terminal) is electrically connected to the first electrode 114a by solder or conductive paste (not shown).

A third insulating layer 136 is arranged on the first electrode 114a and the second insulating layer 132. The third insulating layer 136 is arranged to expose an upper surface of the first LED chip 116a and contact a side surface. In other words, the third insulating layer 136 is arranged to expose the upper surface of the first LED chip 116a and embed other portions. Such the third insulating layer 136 is formed of an organic resin material. For example, a material such as polyimide, acrylic, or epoxy can be used as the organic resin material. The third insulating layer 136 may be a stacked layer of the foregoing materials. In addition, the third insulating layer 136 may be formed of an inorganic insulating material such as silicon oxide.

Although the third insulating layer 136 is preferably arranged so as to be in plane with an upper end surface of the first LED chip 116a, in the case where the upper surface of the third insulating layer is lower than the upper surface of the first LED chip 116a, it is preferably arranged such that the third insulating layer 136 rises toward the first LED chip 116a so as to form an inclined surface at a stepped portion (an interface between the third insulating layer 136 and the first LED chip 116a). The second electrode 118 is arranged so as to extend continuously from the upper surface of the first LED chip 116a to the upper surface of the third insulating layer 136. The second electrode 118 is arranged to extend over substantially the entire surface of the pixel 106 (and thus, substantially the entire surface of the display portion 104), but since the third insulating layer 136 has such a structure as described above, it is possible to prevent a stepwise break (in other words, a crack) at the end of the first LED chip 116a, thereby impairing the electrical connection (in other words, a conduction failure).

The first reflection control layer 120 is arranged on the upper surface of the second electrode 118. The first opening 124a is provided on an area of the first reflection control layer 120 that overlaps the first LED chip 116a. The first reflection control layer 120 has a first surface on the side of the second electrode 118 and a second surface on opposite to the first surface (the side opposite to the second electrode 118). The first reflection control layer 120 has a property that a reflectance of the first surface is higher than a reflectance of the second surface. In addition, the first reflection control layer 120 has a property that a sheet resistance of the first surface is lower than a sheet resistance of the second surface. Such a property of the first reflection control layer 120 can be achieved by stacking a plurality of films having different optical and electrical property. The first reflection control layer 120 has, for example, a structure in which a first layer 121, a second layer 122, and a third layer 123 are stacked from the side of the second electrode 118.

Figure 4:
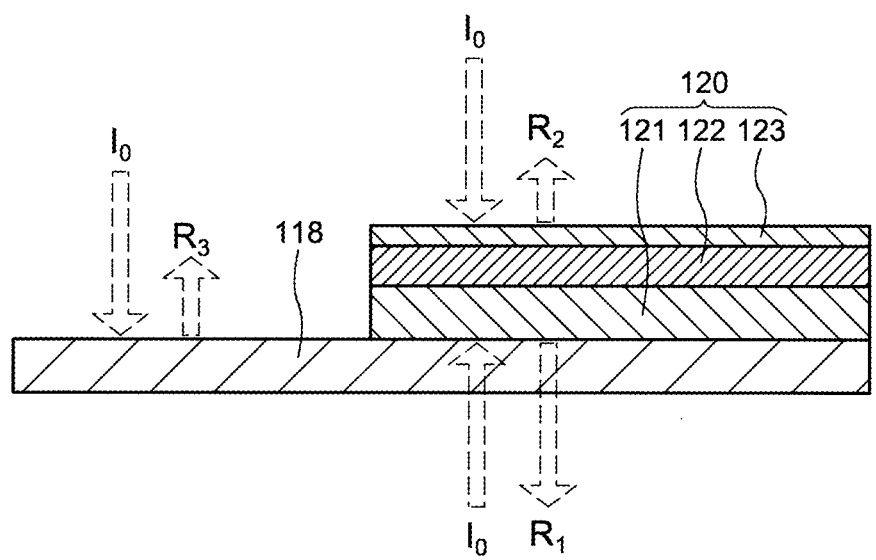
FIG. 4 is a schematic diagram illustrating optical characteristics of a reflection control layer arranged in a pixel of a display device according to an embodiment of the present invention.

FIG. 4 is a schematic diagram illustrating optical characteristics of the first reflection control layer 120 and the second electrode 118. The first reflection control layer 120 has a structure in which a first layer 121a, the second layer 122, and the third layer 123 are stacked in this order on the second electrode 118. In this stacked structure, it is assumed that the first reflection control layer 120 has a reflectance of the light ($I_0$) entering the first layer 121 from the side of the second element 118 is $R_1$, a reflectance of the light ($I_0$) entering the third layer 123 is $R_2$, and a reflectance of the light ($I_0$) entering the second element 118 is $R_3$. In the case where the strength of the incident light ($I_0$) is constant, the first reflection control layer 120 has a property that the reflectance $R_1$ of the first surface is greater than the reflectance $R_2$ of the second surface and the reflectance $R_3$ of the second element 118, and the reflectance $R_2$ of the second surface is smaller than the reflectance $R_3$ of the second element 118.

The first layer 121 of the first reflection control layer 120 is formed of a metal material. For example, the first layer 121 is formed of a metal material such as aluminum (Al), silver (Ag), and copper (Cu). The second layer 122 is formed of a metal material or a semiconductor material. For example, the second layer 122 is formed of a metal material or an alloy material selected from titanium (Ti), tantalum (Ta), and molybdenum (Mo). In addition, the second layer 122 is formed of a semiconductor material such as silicon (Si), germanium (Ge). The third layer 123 is formed of a material having a refractive index from 1.7 to 2.0. The third layer 123 can be formed of a metal oxide, and can be formed of, for example, a material such as ITO (indium tin oxide), IZO (indium zinc oxide), ZnO (zinc oxide), or MgO (magnesium oxide). In addition, the third layer 123 may be formed of an insulating material such as silicon nitride, aluminum nitride, aluminum oxide, or the like.

The first reflection control layer 120 can have a lower sheet resistance on the first surface than on the second surface by forming the first layer 121, the second layer 122, and the third layer 123 from the material described above. The first layer 121 formed of a metal material such as aluminum (Al), silver (Ag), copper (Cu) is arranged in contact with the second electrode 118. The first reflection control layer 120 is arranged so as to overlap the second electrode 118 except for the first opening 124. Such a configuration can substantially reduce the sheet resistance of the second electrode 118. In addition, since a metal material such as aluminum (Al), silver (Ag), copper (Cu) for forming the first layer 121 is excellent in thermal conductivity, it is possible to dissipate heat generated by the LED chip by arranging the metal material in contact with the second electrode 118. As a result, it is possible to prevent a decrease in the amount of light due to the temperature rise of the LED chip.

The third layer 123 is preferred to be formed to a thickness of 100 nm or less, preferably 40 nm to 60 nm, e.g., 50 nm, from the optical property. The reflected light can be reduced by the interference effect of light by forming the third layer 123 having such a film thickness on the second layer 122. In particular, it is possible to reduce the reflectance of the wavelength of 500 nm to 570 nm, which is considered to have relatively high visual sensitivity, by forming the third layer 123 to a thickness of 40 nm to 60 nm.

As described above, the first reflection control layer 120 according to the present embodiment can reduce external light reflectance of the second surface (i.e., the viewing side of a display screen in the display device 100). The reduction in the external light reflectance can be obtained by the optical interference effect due to the stacked structure of the second layer 122 and the third layer 123. In this sense, the second layer 122 and the third layer 123 may be referred to as blackening layers.

Figure 5:
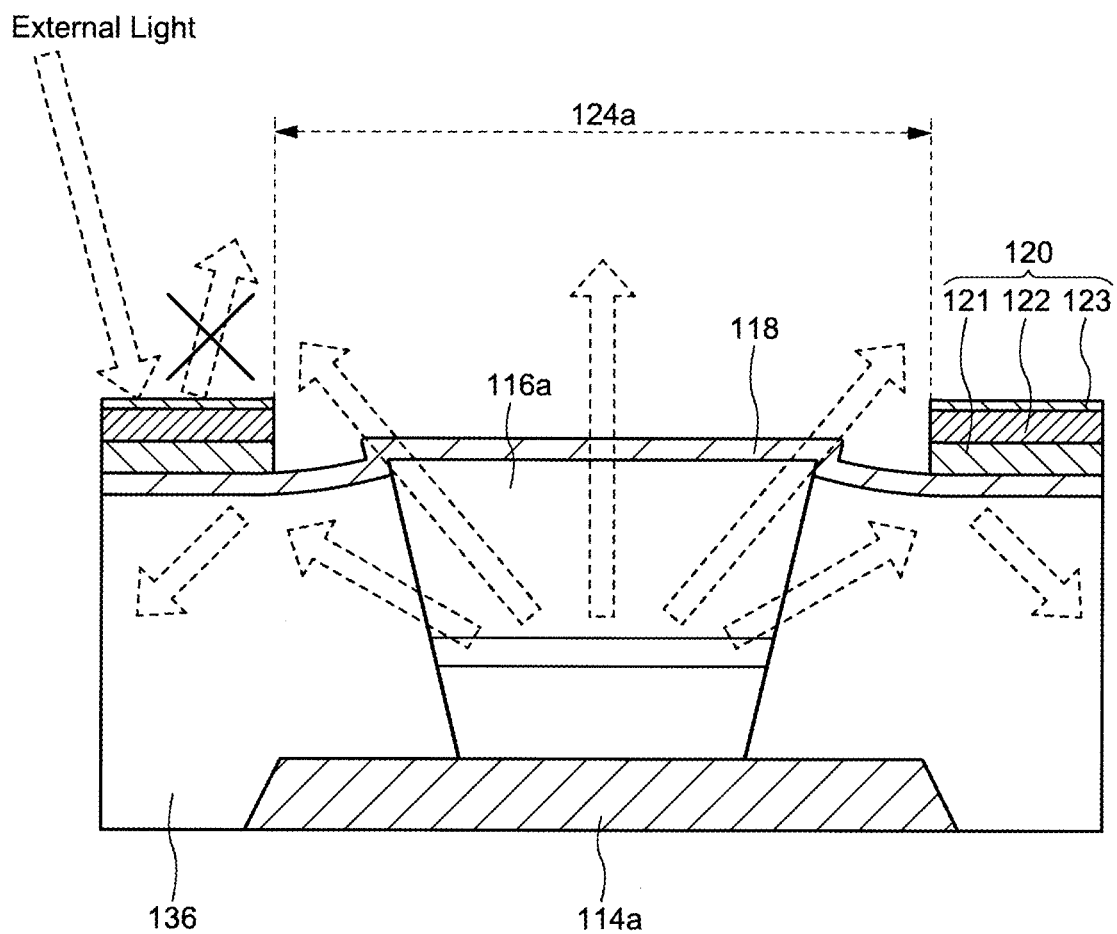
FIG. 5 is a diagram schematically illustrating states of light emitted from an LED chip in a pixel of a display device according to an embodiment of the present invention.

FIG. 5 schematically shows a state in which the first LED chip 116a emits light. The light emitted by an active layer of the first LED chip 116a is radiated to the periphery without directivity. The light emitted from the active layer diagonally upward can be the light emitted from the first sub-pixel 107a by providing an opening end of the first opening 124a provided in the first reflection control layer 120 so as to be located outside the end of the first LED chip 116a (in other words, by making the diameter of the first opening 124a larger than the size of the first LED chip 116a). In addition, the light emitted from the active layer at a shallow angle (the light emitted in the lateral direction) is reflected by the first layer 121 of the first reflection control layer 120, so that stray light can be reduced, and the light emitted from adjacent pixels can be prevented from being overlapped and color-mixed.

On the other hand, the reflection of external light can be reduced by the action of the second layer 122 and the third layer 123 of the first reflection control layer 120. As a result, it is possible to suppress the reflection of the display unit 104 with respect to external light, and it is possible to improve the visibility of the display screen.

Also, for the purpose of reducing external light reflection of the display screen of the display device, it is conceivable to provide a light-shielding layer formed of, for example, a resin containing a black pigment. However, the light-shielding layer which merely absorbs light can reduce reflection of external light, but it becomes a problem that the light-shielding layer absorbs external light and generates heat. The energy conversion efficiency of the LED chip is about 30%, and the remaining 70% is converted into heat to generates heat. Therefore, the display device generates a certain amount of heat generation when the LED chip of each pixel is driven to display an image. In addition to this, when the light-shielding layer heats up, the temperature of the display unit becomes even higher, so that a decrease in the amount of light of the LED chip becomes a problem.

On the other hand, since the first reflection control layer 120 does not absorb external light but acts to visually blacken by utilizing interference effect of light, so that the temperature-rise problem can be solved. Furthermore, the first reflection control layer 120 can dissipate heat by providing a layer having excellent thermal conductivity on the back side of the layer that suppresses external light reflection. The display device 100 according to the present embodiment can solve the heat generation problem and improve reliability by providing the first reflection control layer 120.

Referring again to FIG. 3, the second electrode 118 has a structure electrically connected to the second wiring 134. The second electrode 118 is electrically connected to the second wiring 134 via the contact hole 138 provided in the third insulating layer 136. The second electrode 118 is an electrode common to a plurality of sub-pixels, a constant voltage is applied. Since the second electrode 118 is formed of a transparent conductive film such as ITO, IZO, or the like, a voltage drop due to resistance loss may be a problem. However, the problem of resistance loss can be solved by arranging the second wiring in the display unit 104 and providing a structure for connecting the second wiring 134 for each pixel 106 (or for each pixel of several pixels).

Figure 6:
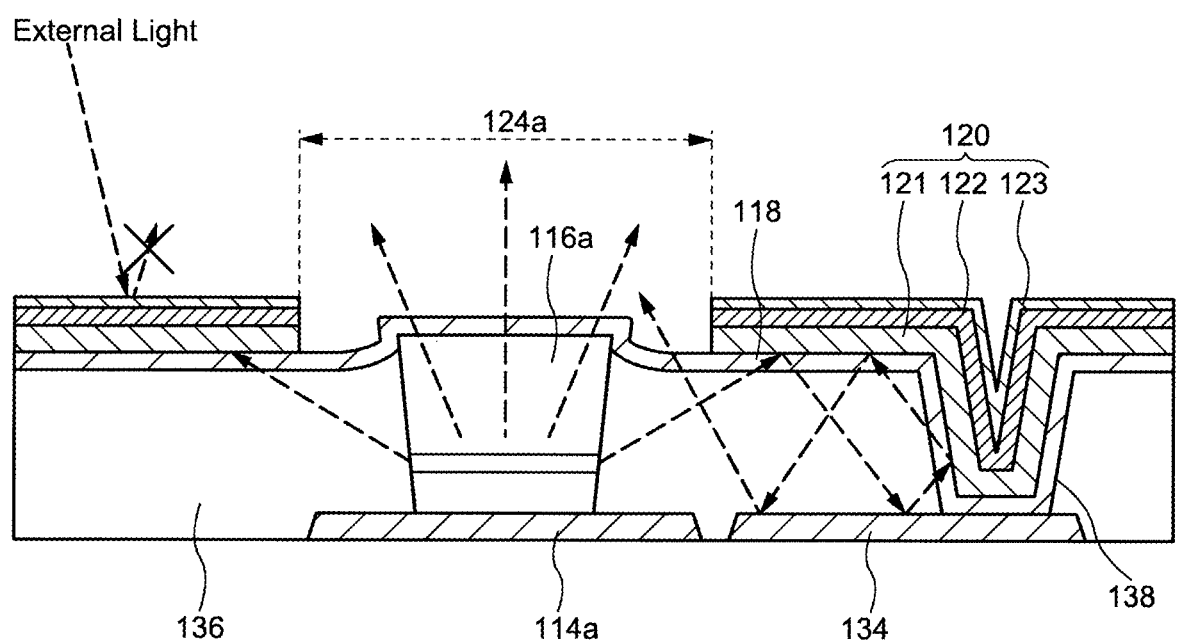
FIG. 6 is a schematic diagram showing an aspect in which in a pixel of a display device according to an embodiment of the present invention, a component in transverse direction among light emitted from an LED chip becomes emitted light due to multiple reflections within an insulating layer.

FIG. 6 is a diagram showing a mode in which a transverse component of light emitted from the LED chip becomes light emitted from the sub-pixel by multiple reflection in the third insulating layer when the structure is provided with the first LED chip 116*a* and the contact hole 138. The first layer 121 constituting the first reflection control layer 120 is a metal film formed of aluminum (Al), silver (Ag), or the like having a high reflectance and is formed in contact with the surface of the second electrode 118. Since the first layer 121 is also formed in the portion of the hole of the contact hole 138, a highly reflective area is formed so as to through the third insulating layer 136. In addition, the first electrode 114 and the second electrode 118 are also formed of a metal material.

In such the structure, among the light emitted from the first LED chip 116*a*, a part of the component emitted transverse at a shallow angle propagates by multiple reflection between the second electrode 118 and the first layer 121 and is reflected at the portion of the contact hole 138, again, multiple reflections propagate between the second electrode 118 and the first layer 121, and a part of the light is emitted from the first opening 124*a*. As described above, the first reflection control layer 120 and the second electrode 118 form a light guide structure, so that it is possible to extract light from the light emitted from the LED chip that cannot be normally extracted as emitted light, thereby improving the light utilization efficiency.

Figure 7:
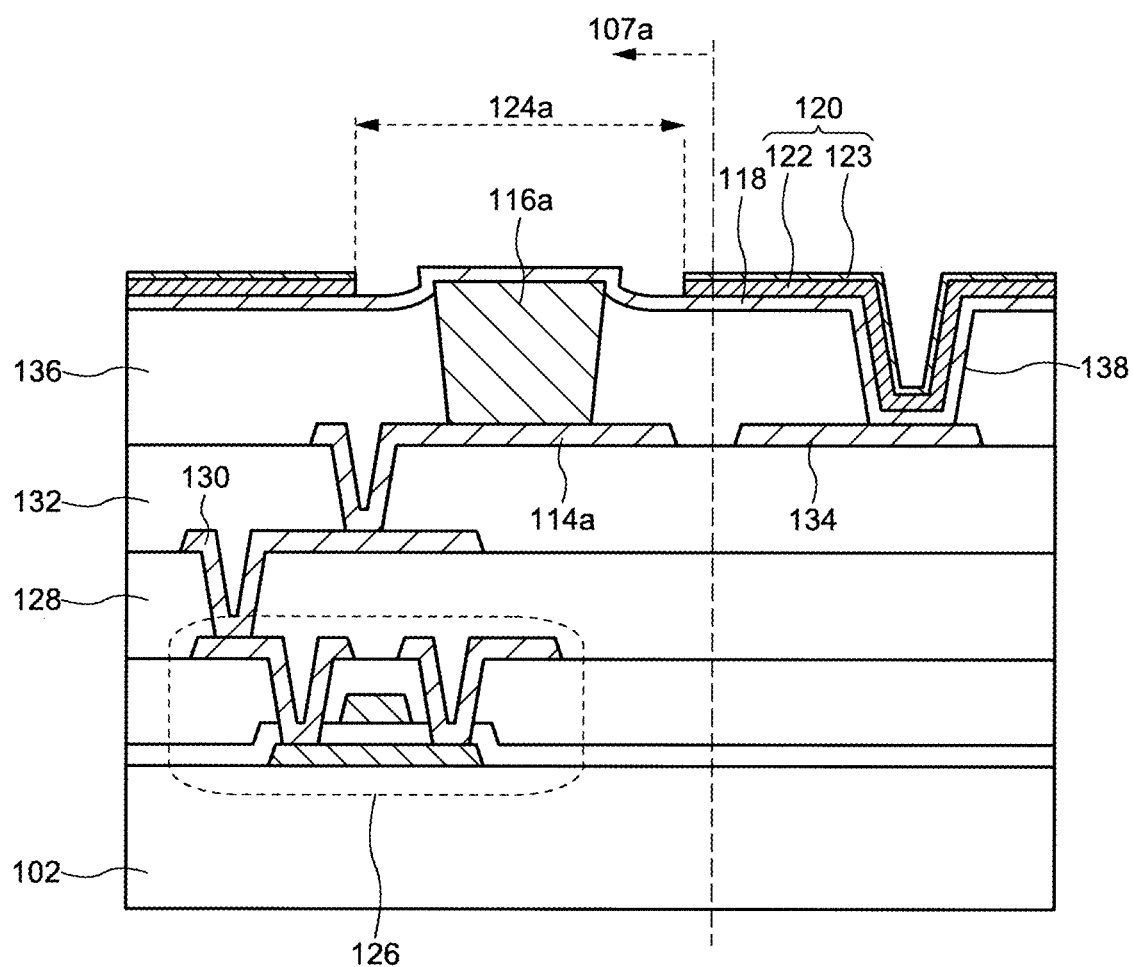
FIG. 7 is a cross-sectional view showing a pixel configuration of a display device according to an embodiment of the present invention.

Also, as shown in FIG. 7, the first layer 121 may be omitted from the first reflection control layer 120. Although the light utilization efficiency is slightly reduced by omitting the first layer 121 of the first reflection control layer 120, it is possible to suppress a reflection of external light at the pixel 106. In addition, since the second layer 122 is formed of a metal material, it is possible to dissipate the heat generated by the LED chip.

Figure 8:
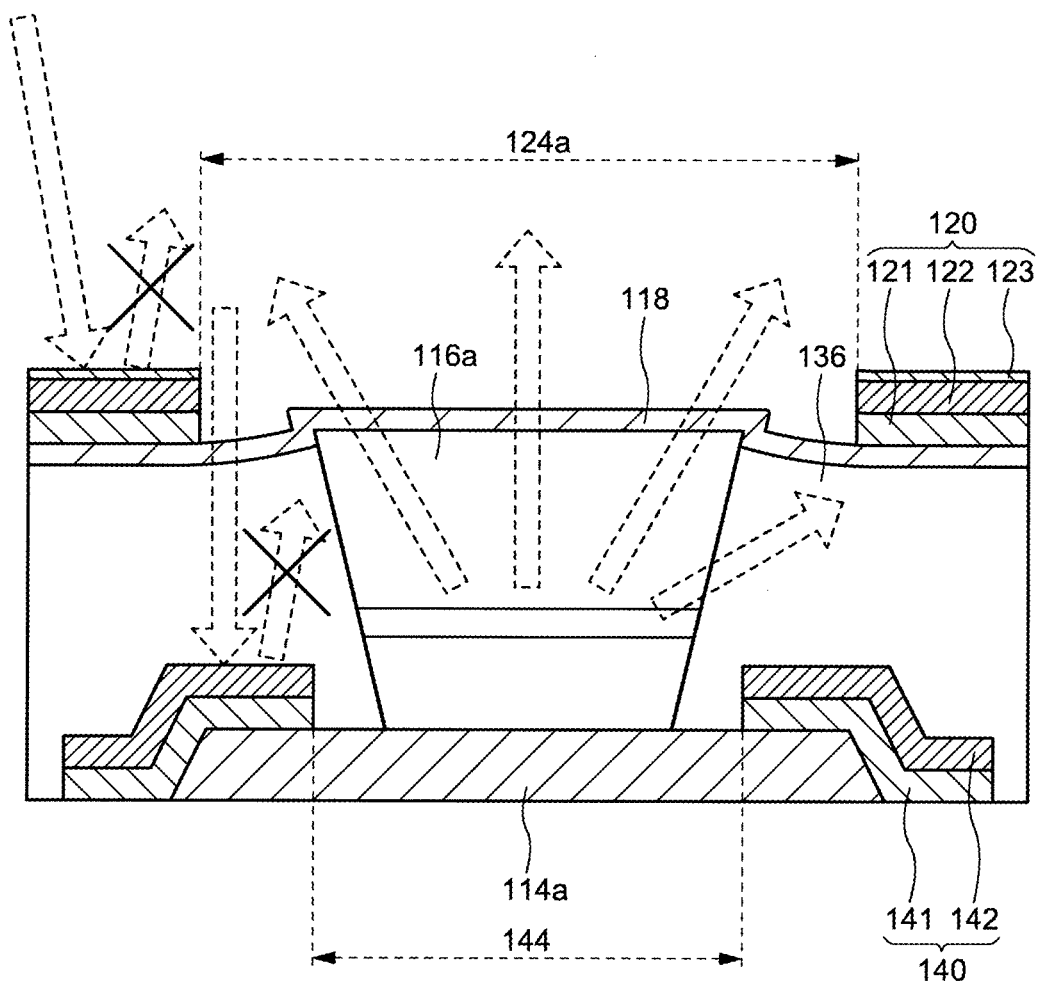
FIG. 8 is a diagram illustrating states of light emitted from an LED chip in a pixel of a display device according to an embodiment of the present invention.

FIG. 8 shows a structure in which a second reflection control layer 140 is further arranged on the first electrode 114*a*. The second reflection control layer 140 is arranged on an upper surface of the first electrode 114. In addition, as shown in FIG. 8, the second reflection control layer 140 may be arranged along the upper surface and the side surface of the first electrode 114.

The second reflection control layer 140 includes a fourth layer 141 and a fifth layer 142 from the first electrode 114 side. In this case, the fourth layer 141 corresponds to the second layer 122 and the fifth layer 142 corresponds to the third layer 123. That is, the fourth layer 141 is formed using a metal material or a semiconductor material, and is formed of, for example, a metal material or an alloy material selected from titanium (Ti), tantalum (Ta), and molybdenum (Mo). In addition, the fourth layer 141 is formed of a semiconductor material such as silicon (Si), germanium (Ge). The fifth layer 142 is formed of a material having a refractive index from 1.7 to 2.0, and is formed of, for example, ITO (indium tin oxide), IZO (indium zinc oxide), ZnO (zinc oxide), MgO (magnesium oxide), or the like. In addition, the fifth layer 142 is formed of an insulating material such as silicon nitride, aluminum nitride, aluminum oxide, or the like.

The fifth layer 142 is preferred to be formed to a thickness of 100 nm or less, preferably 40 nm to 60 nm, e.g., 50 nm, from an optical property. The fifth layer 142 having such a thickness is formed on the fourth layer 141, so that the reflected light can be reduced by the interference effect of light. In particular, the fifth layer 142 having a thickness of 40 nm to 60 nm can reduce the reflectance at a wavelength of 500 nm to 570 nm, which is considered to have relatively high visual sensitivity.

The second reflection control layer 140 has a second opening 144 that exposes an upper surface of the first electrode 114*a*. The second opening 144 has a larger diameter than the first LED chip 116*a*. The first LED chip 116*a* is arranged inside the second opening 144 and electrically connected to the electrode 114*a*.

The second reflection control layer 140 having such a structure can suppress external light reflection. As shown in FIG. 8, in the case where the opening end of the first opening 124*a* is arranged outside the end portion of the first LED chip 116*a*, the first electrode 114*a* is exposed to the first opening 124. In other words, it is possible to extract more radiation from the first LED chip 116*a* by increasing the diameter of the first opening 124*a*, but it also increases the area that the first electrode 114*a* is exposed to the first opening 124. Since the first electrode 114*a* is formed of a metal material, the external light reflection also becomes a problem in the portion exposed from the first electrode 114*a*. In this case, external light reflection can be reduced by arranging the second reflection control layer 140 on the upper surface of the first electrode 114*a*.

In addition, if only the external light reflection is a problem, in FIG. 8, instead of the first reflection control layer 120, only the second reflection control layer 140 may be arranged in a void around the first LED chip 116*a*.

Figure 9:
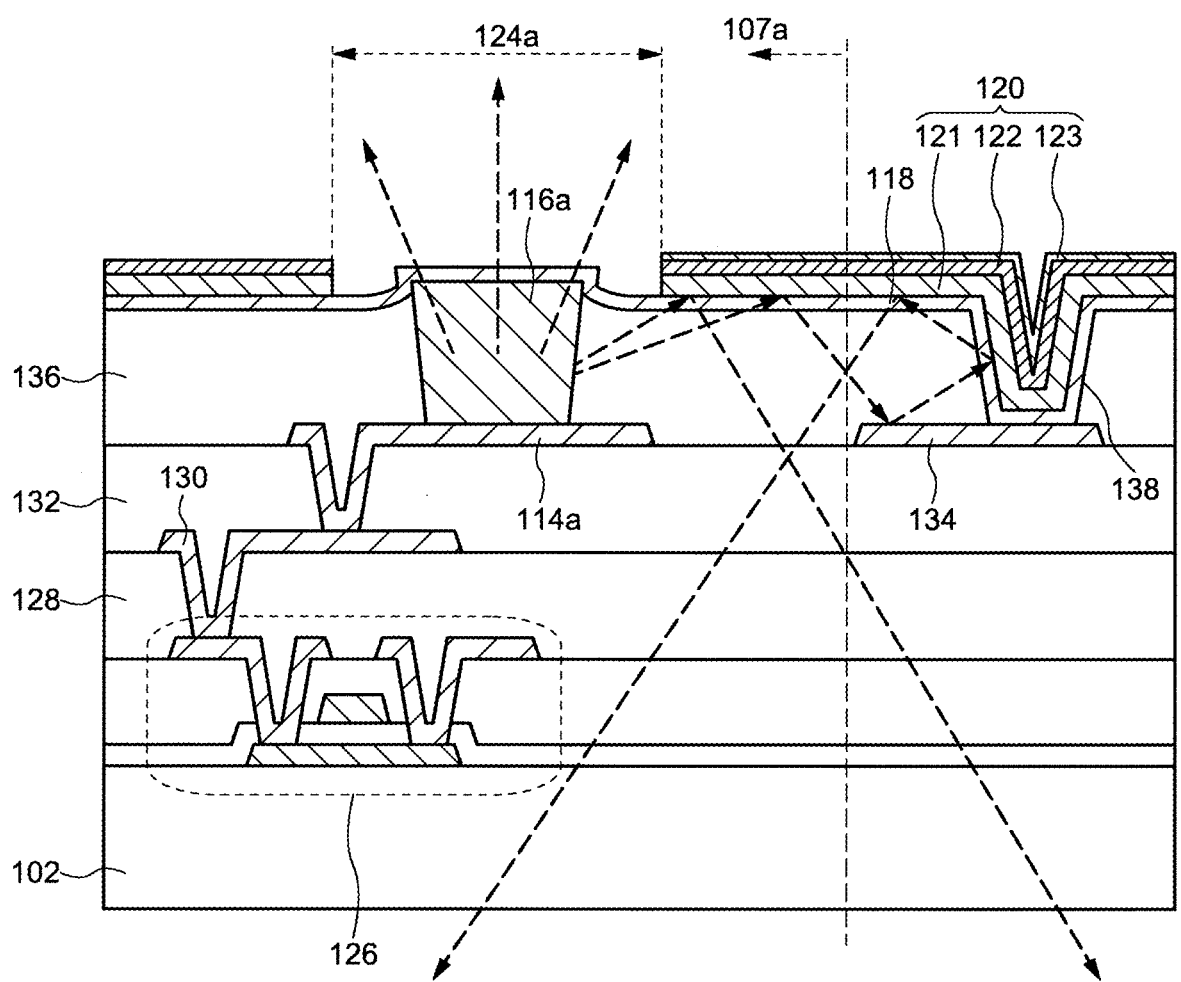
FIG. 9 is a cross-sectional view showing a pixel configuration of a display device according to and embodiment of the present invention.

In addition, as shown in FIG. 9, when a gap is provided between the first electrode 114*a* and the second wiring 134, and a reflection suppressing layer is configured to extend to the gap, a part of stray light from the first LED chip 116*a* can be extracted to a back surface side of the substrate and can be formed as a double-sided display. Further, it can be configured as a transparent display by reducing the sizes of wirings and the first LED chip 116*a*, increasing the ratio of the gap as much as possible, and arranging the reflection control layer for reflecting stray light so as to be limited only to the vicinity of the first LED chip 116*a*. In this case, the reflection control layer limitedly arranged around the first LED chip 116*a* may be spaced apart from the second wiring 134.

Although the structure of the first sub-pixel 107*a* has been mainly described in the present embodiment, the second sub-pixel 107*b* and the third sub-pixel 107*c* also have the same configuration. The first reflection control layer 120 covers the pixel 106 except for the area of the first opening 124 and is arranged over the entire display unit 104. The display device 100 according to the present embodiment has a first reflection control layer 120, which allows the external light reflection of the display screen to be reduced. Although a circularly polarizing plate may be used to reduce the external light reflection of the display screen, the amount of light emitted from the LED is reduced by half. On the other hand, the display device 100 according to the present embodiment can effectively utilize the light from the LED chip 116 without attenuating the amount of light while suppressing the external light reflection. Rather, a part of the light that is guided to the third insulating layer 136 can be changed to emitted light, and the efficiency of light utilization can be improved. Furthermore, the external light reflection by the first electrode 114 can be reduced by arranging the second reflection control layer 140 on the first electrode 114. In addition, since the first reflection control layer 120 is excellent in thermal conductivity, it is possible to suppress a decrease in brightness due to the heat generation of the LED chip.

A structure of a pixel that can be appropriately modified and implemented by a person skilled in the art based on the pixel structure of the display device described above as an embodiment of the present invention also belongs to the technical scope of the present invention as long as the gist of the present invention is included.

Within the scope of the idea of the present invention, it is understood that various modifications and changes can be made by those skilled in the art and that these modifications and changes also fall within the scope of the present invention. For example, the addition, deletion, or design change of components, or the addition, deletion or condition change of process as appropriate by those skilled in the art based on each embodiment are also included in the scope of the present invention as long as they are provided with the gist of the present invention.

In addition, it is understood that the effect obvious from the description in the specification or easily predicted by persons ordinarily skilled in the art is apparently derived from the present invention.

What is claimed is:

1. A display device, comprising:
   a first electrode;
   an LED chip on the first electrode;
   an insulating layer embeds the first electrode, contacts a side surface of the LED chip, and exposes an upper surface of the LED chip;
   a second electrode having translucency in contact with an upper surface of the insulating layer and the upper surface of the LED chip; and
   a first reflection control layer on an upper surface of the second electrode and having a first opening in an area overlapping with the LED chip,
   wherein the first reflection control layer has a first surface on a side of the second electrode and a second surface on opposite to the first surface, and a reflectance of the first surface is higher than a reflectance of the second surface.

2. The display device according to claim 1, wherein the first reflection control layer includes a first layer on the side of the second electrode and a second layer on a side of the first layer opposite to the second electrode, and
   a sheet resistance of the first layer smaller than a sheet resistance of the second electrode.

3. The display device according to claim 1, wherein the first reflection control layer includes:
   a first layer in contact with the second electrode and containing aluminum;
   a second layer on the first layer and containing one metal selected from titanium, tantalum, and molybdenum; and
   a third layer on the second layer and having a refractive index from 1.7 to 2.0.

4. The display device according to claim 3, wherein the third layer is a transparent conductive film containing indium oxide or zinc oxide.

5. The display device according to claim 3, wherein the third layer is selected from a silicon nitride film, an aluminum nitride film, and an aluminum oxide film.

6. The display device according to claim 3, wherein the third layer has a film thickness of 100 nm or less.

7. The display device according to claim 6, wherein the third layer has a film thickness of 40 nm or more and 60 nm or less.

8. The display device according to claim 1, further comprising a second reflection control layer,
   wherein the second reflection control layer is arranged on the first electrode and has a second opening for exposing an upper surface of the first electrode.

9. The display device according to claim 8, wherein the second reflection control layer includes:
   a fourth layer containing one metal selected from titanium, tantalum, and molybdenum; and
   a fifth layer on the fourth layer and having a refractive index from 1.7 to 2.0.

10. The display device according to claim 9, wherein the fifth layer is a transparent conductive film containing indium oxide or zinc oxide.

11. The display device according to claim 9, wherein the fifth layer is selected from a silicon nitride film, an aluminum nitride film, and an aluminum oxide film.

12. The display device according to claim 9, wherein the fifth layer has a film thickness of 100 nm or less.

13. The display device according to claim 12, wherein the fifth layer has a film thickness of 40 nm or more and 60 nm or less.

14. The display device according to claim 1, wherein an end portion of the first opening is located outside the LED chip.

* * * * *